United States Patent
Negoi et al.

(10) Patent No.: US 8,063,623 B2
(45) Date of Patent: Nov. 22, 2011

(54) ANALOG COMPENSATION CIRCUIT

(75) Inventors: Andy Negoi, Crolles (FR); Michel Zecri, Labuissiere (FR)

(73) Assignee: Synopsys, Inc., Mountain View, CA (US)

(*) Notice: Subject to any disclaimer, the term of this patent is extended or adjusted under 35 U.S.C. 154(b) by 272 days.

(21) Appl. No.: 12/299,305

(22) PCT Filed: Apr. 24, 2007

(86) PCT No.: PCT/EP2007/053968
§ 371 (c)(1),
(2), (4) Date: Oct. 31, 2008

(87) PCT Pub. No.: WO2007/128682
PCT Pub. Date: Nov. 15, 2007

(65) Prior Publication Data
US 2009/0315532 A1  Dec. 24, 2009

(30) Foreign Application Priority Data
May 3, 2006 (EP) .................... 06300426

(51) Int. Cl.
*G05F 3/04* (2006.01)
(52) U.S. Cl. ................... 323/312; 323/907
(58) Field of Classification Search .......... 323/312–317, 323/907; 327/538, 540–543
See application file for complete search history.

(56) References Cited

U.S. PATENT DOCUMENTS

| | | | |
|---|---|---|---|
| 5,047,670 A | 9/1991 | Tran | |
| 6,087,853 A | 7/2000 | Huber et al. | |
| 6,556,022 B2 | 4/2003 | To et al. | |
| 6,697,283 B2* | 2/2004 | Marotta et al. | 365/185.21 |
| 7,336,117 B2* | 2/2008 | La Malfa et al. | 327/333 |
| 2002/0109490 A1 | 8/2002 | Engl | |
| 2002/0130684 A1 | 9/2002 | Labram et al. | |
| 2003/0169081 A1 | 9/2003 | Han et al. | |
| 2005/0134364 A1 | 6/2005 | Bhattacharya et al. | |

FOREIGN PATENT DOCUMENTS

| | | |
|---|---|---|
| EP | 0184875 A1 | 6/1986 |
| JP | 06001899 | 1/1994 |

OTHER PUBLICATIONS

Australian Patent Office, Examination Report dated Dec. 8, 2009 for Singapore patent application No. SG 200808099-6.

(Continued)

*Primary Examiner* — Matthew Nguyen
(74) *Attorney, Agent, or Firm* — Jones Day

(57) ABSTRACT

The present disclosure relates to a compensation circuit for providing compensation over PVT variations within an integrated circuit. Using a low voltage reference current source, the compensation circuit generates directly, from an on-chip reference low voltage supply ($V_{DD}$), a reference current ($I_{ref}$) that is constant over PVT variations, whereas a detection current ($I_z$) that is variable over PVT variations is generated by a sensing circuit, which is based on a current conveyor, from a low voltage supply ($V_{DDE}-V_{DD}$) applied across a single diode-connected transistor (M10) corresponding to a voltage difference between two reference low voltage supplies. Both currents ($I_{ref}, I_z$) are then compared inside a current mode analog-to-digital converter that outputs a plurality of digital bits. These digital bits can be subsequently used to compensate for PVT variations in an I/O buffer circuit.

20 Claims, 4 Drawing Sheets

OTHER PUBLICATIONS

European Patent Office, Communication pursuant to Article 94(3) EPC dated Sep. 24, 2009 for European patent application No. 07728424.8.

Korean Patent Office, English translation of the Notice of Preliminary Rejection for Korean Office action dated Jul. 13, 2010 for Korean patent application No. 2008-7029458.

ISA/EP, International Search Report and Written Opinion dated Oct. 18, 2007 for international application No. PCT/EP2007/053968.

The International Bureau of WIPO, International Preliminary Report on Patentability dated Nov. 4, 2008 for international application No. PCT/EP2007/053968.

A Delay-Based PVT Detection Mechanism Sep. 21, 2005.

* cited by examiner

ANALOG COMPENSATION CIRCUIT

The present invention relates to an analog compensation circuit, and more particularly to a very low power analog compensation circuit for providing compensation over process, voltage and temperature (PVT) variations within an integrated circuit.

Output buffer circuits (e.g., input/output (I/O) circuits), are widely used to facilitate the transfer of data and/or signals from a component to another component within a given chip or from a chip to another chip, while being routed using links or transmission lines such as buses, printed circuit board (PCB) traces, or any other electrically conductive similar structures.

Due to the ever-increasing speed of the integrated circuits (IC), these links behave nowadays as transmission lines, the characteristic impedance (typically ranged from 50 to 75 ohms) of which will be required to continuously match the impedance of the output buffer circuits or transmitters, in order to avoid the undesirable reflections and ringing which result in reduced noise immunity and timing skew.

However, a buffer circuit may be subjected to variations in supply voltage, manufacturing process and temperature (PVT). For example, process variations resulting from IC fabrication can affect the threshold voltage, channel length and width, doping, carrier mobility, and so one. These variations are thus unavoidable and result in departure from optimal performance of the buffer circuits, such that PVT compensation techniques are required.

Moreover, the performance will be also detracted by the dynamic power consumption in the buffer circuits which directly depends on the capacitive switching operation, as well as the interferences through the ground and supply lines caused by any fast and simultaneous switching operation.

Several prior art solutions have been devised to compensate for PVT variations in a buffer circuit. For example, U.S. Pat. No. 6,087,853 entitled "Controlled Output Impedance Buffer Using CMOS Technology" describes a way to sense the PVT condition and match the output impedance of each output buffer circuit within an output buffer driver to the impedance of a transmission line by switching on or off various output buffer circuits. The detection of the PVT condition is made by injecting a PVT-independent reference current through a transistor of a predefined size before converting the resulting drain-source voltage into a digital code. However, this approach has the disadvantage of consuming a lot of energy through the voltage conversion and generating the reference current in a manner that is weakly versatile.

Another example can be given by U.S. Pat. No. 2002/0109490A1 entitled "Reference Current Source Having MOS Transistors", which describes a way to produce a reference current by adding two other currents that depend on the PVT condition in a reverse manner. However, this approach still presents several disadvantages. It consumes not only a lot of energy through the use of two voltage sources and a voltage-to-current converter, but also area through the use of integrated resistors for generating the reference current. Additionally, these integrated resistors have very often a large variation under modern processes.

FIG. 1 illustrates a block diagram of a compensation circuit 10 for a buffer circuit 15 such as commonly found in the prior art. A reference voltage generator 11 generates from an external power supply ($V_{ext}$) a reference voltage which is converted into a reference current through a voltage-to-current converter 12. The reference current is then compared through an analog-to-digital converter 14 to a current, which is variable over PVT variations and supplied by a current generating means 13. The most used way to generate such a reference current is to use a bandgap type voltage reference block providing a bandgap reference voltage of less than 1.21 V that is constant over PVT variations, in addition to an integrated resistor or high precision external resistor for allowing conversion into current. However, integrated resistors usually exhibit a large variation in the modern processes and cover a lot of space on the chip. Using high precision or trimmed external resistors also present the disadvantage of increasing production costs.

It is therefore preferred to provide a very low power analog compensation circuit for providing compensation over process, voltage and temperature (PVT) variations within an integrated circuit and for a buffer circuit in particular.

In a first aspect, the invention provides a compensation circuit for providing compensation for at least one of process, voltage and temperature (PVT) variations within an integrated circuit, said compensation circuit comprising at least:

a) a reference circuit for generating a reference current ($I_{ref}$) that is constant over PVT variations, said reference circuit being configured to directly generate said reference current ($I_{ref}$) from a first voltage supply ($V_{DD}$), which is internal to said integrated circuit and configured to provide a low voltage supply;

b) a sensing circuit, which comprises an output terminal (Z) and which is configured to provide at said output terminal (Z) a detection current ($I_z$) that is variable over PVT variations, and to sense said PVT variations through said detection current ($I_z$).

The compensation circuit according to the first aspect of the invention comprises a reference circuit for directly generating from a first voltage supply, which is an on-chip low voltage supply, a reference current that is constant over PVT variations. Thereby, a bandgap type voltage reference block for generating a bandgap reference voltage as well as an integrated or high precision external resistor for converting said bandgap reference voltage into a reference current, are not needed, which enables to save energy, silicon area on the chip and cost.

The compensation circuit according to the first aspect of the invention further comprises a sensing circuit for sensing PVT variations through a detection current generated by this sensing circuit. Thereby, PVT variations can be detected.

In a second aspect, the invention provides a method for providing compensation for at least one of process, voltage and temperature (PVT) variations within an integrated circuit, said method comprising at least the steps of:

a) generating a reference current ($I_{ref}$) which is constant over PVT variations, said reference current ($I_{ref}$) being generated directly from a first voltage supply ($V_{DD}$), which is internal to said integrated circuit and configured to provide a low voltage supply;

b) sensing PVT variations through a detection current ($I_z$) which is variable over PVT variations, said detection current ($I_z$) being provided by said sensing circuit.

In the following, advantageous embodiments will be described, which are also defined in the dependent claims. The embodiments can be combined with each other, unless explicitly stated otherwise.

Thus, the reference circuit may comprise at least a proportional-to-absolute-temperature (PTAT) circuit having a first diode element and a series arrangement of a second diode element and a second resistor, which are configured in such a manner that a voltage difference across said second resistor between a voltage across said first diode element and a voltage across said series arrangement exists. Thereby, a positive temperature coefficient (PTC) current can be generated through said first and second diode elements.

Moreover, said first and second diode elements may alternatively be diode-connected transistors, and said second diode element may additionally be replaced by a set of several parallel-connected diode elements for enabling a distribution of the second current that flows through said second diode element.

The reference circuit further preferably comprises first and third resistive elements, which are configured in such a manner that a negative temperature coefficient (NTC) current can be generated through said first and third resistive elements.

In another embodiment, the reference circuit further comprises a current mirror being supplied by said reference voltage and having at least three transistors for mirroring a fifth current that is constant over PVT variations into a sixth current that is constant over PVT variations, which is in turn mirrored for thereby generating said reference circuit.

In a further embodiment, the reference circuit further comprises an operational amplifier with at least two complementary input terminals, which is configured to drive said current mirror through the drive input of the transistors that form said current mirror. Due to high impedance of the drive input, said two complementary input terminals will be thereby maintained at a same voltage potential.

Moreover, the sensing circuit may comprise a current conveyor, such as a first generation current conveyor, having its reference terminal connected to said first voltage supply or a suitable reference voltage, and a diode-connected transistor connected between the input terminal of said current conveyor and a second voltage supply. Due to the well-known current conveyor configuration, said input and reference terminals will be virtually shorted for thus generating a low voltage difference across said single diode-connected transistor that will be then passed through by a low current. This current will be sufficiently low in order to not need to be restricted using a series arrangement of several diode-connected transistors, whose variation range of the process parameters (threshold voltage, carrier mobility, etc.) is rather large. Furthermore, since the influence of the process parameters, supply voltage, and temperature is monitored by said single diode-connected transistor, the power consumption of said current conveyor will be drastically reduced.

The compensation circuit may further comprise an analog-to-digital converter for thus comparing said reference and said detection currents between each other and converting the result into a multi-bit compensation code.

This compensation code may then be used by a buffer circuit for allowing it to adapt its driving strength.

The present invention will be now described based on preferred embodiments with reference to the accompanying drawings in which.

Figure 1:
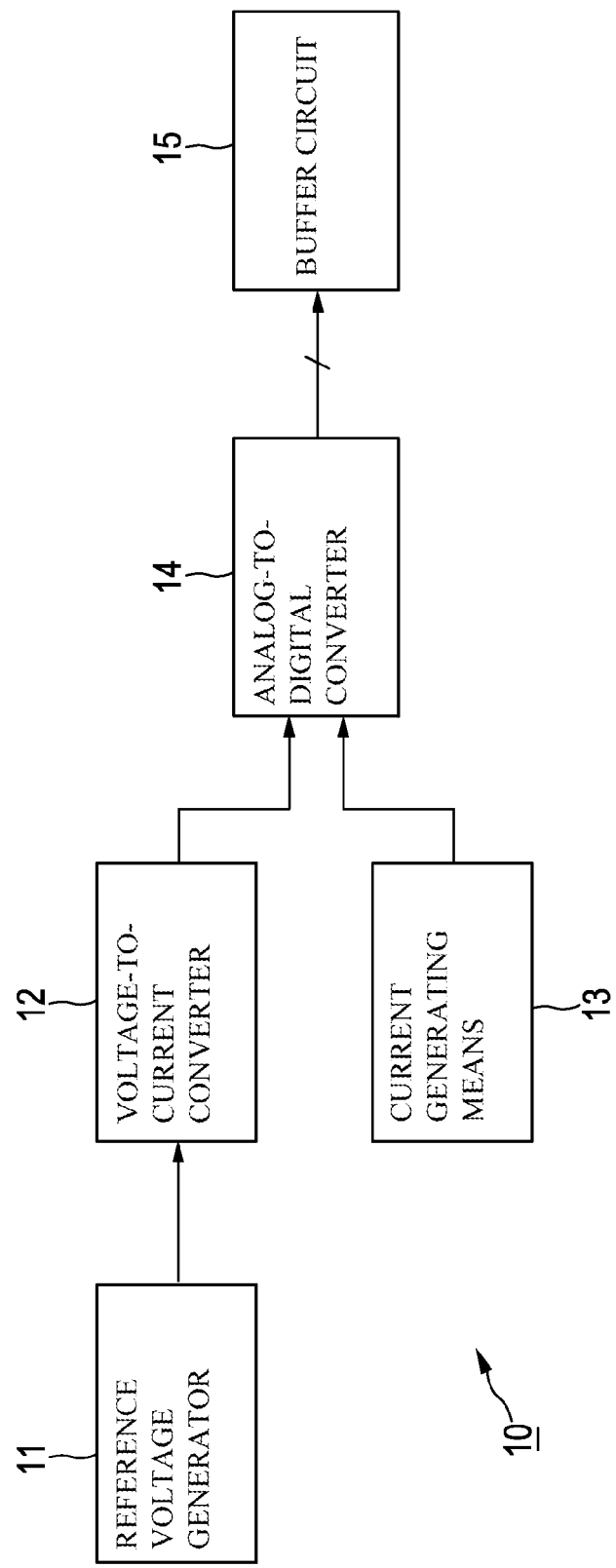
FIG. 1 shows a block diagram of a compensation circuit for a buffer circuit according to the prior art.
Figure 2:
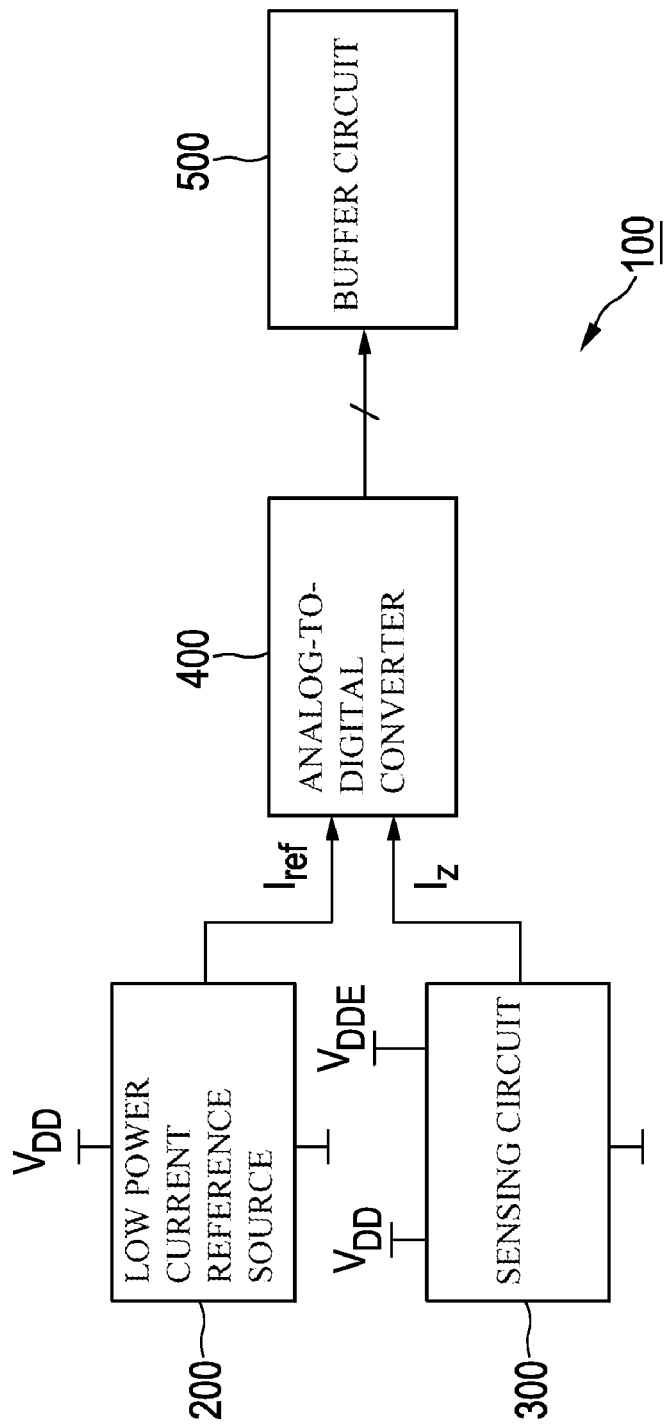
FIG. 2 shows a block diagram of a compensation circuit for a buffer circuit according to a preferred embodiment of the invention.

FIG. 2 is a block diagram of a compensation circuit 100 for a buffer circuit 500 according to a preferred embodiment of the invention. A reference current $I_{ref}$, which is by definition a current constant over PVT variations, is directly generated by a low power reference current source 200 from a reference low voltage supply $V_{DD}$, such as the digital core voltage supply, for example, which is present on every integrated circuit with a constant value ranging around 1.0 V. A detection current $I_z$, which is a current variable over PVT variations, is generated by a sensing circuit 300, the configuration of which is based on a current conveyor 310, from a low voltage supply $(V_{DDE}-V_{DD})$ corresponding to a voltage difference $\Delta V$ between a reference high voltage supply $V_{DDE}$, such as a high input/output (I/O) voltage supply for example ranging between 1.8 V and 2.5 V, and the lower voltage supply $V_{DD}$. Both analog currents $I_{ref}$, $I_z$ are subsequently compared at any time through a plurality of comparators inside a current mode analog-to-digital converter (ADC) 400 that may be a parallel analog-to-digital converter, such as a flash converter for example, and outputs a plurality of digital bits for constituting a PVT compensation code. Such a code can thus be used by a pre-driver and output section (not shown) of an I/O buffer circuit 500 in order to control, for example, output impedance and/or slew rate.

Figure 3:
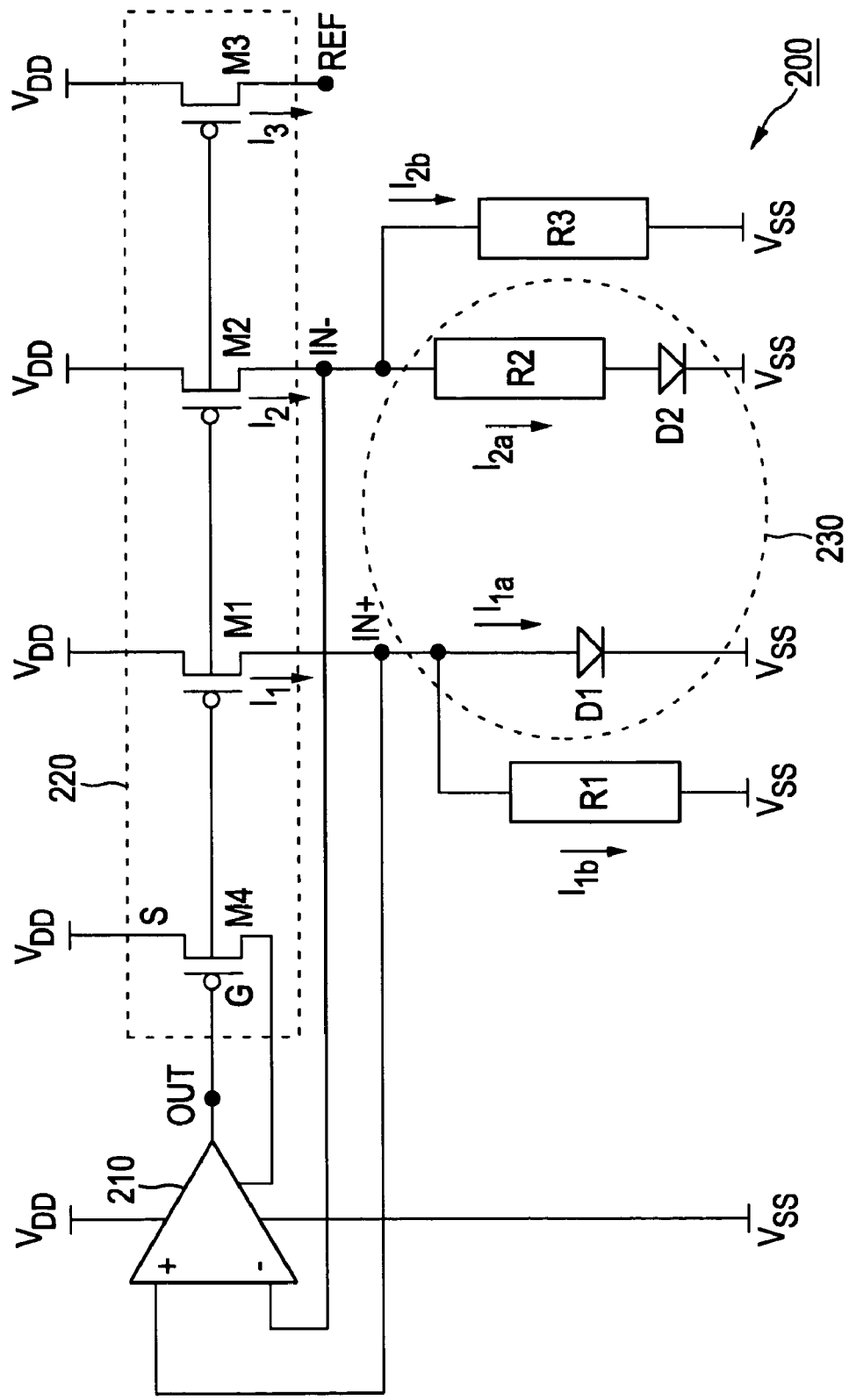
FIG. 3 shows a schematic diagram of a reference current source such as used in the compensated buffer circuit of FIG. 2.

FIG. 3 depicts a schematic diagram of a reference current source 200 such as used in the compensation circuit 100 according to the preferred embodiment of the invention. Such a reference current source 200 includes at least a current mirror circuit 220 made up of first, second, third, and fourth transistors M1, M2, M3, and M4 having identical polarity and wherein the first, second, and third transistors M1-M3 have an aspect ratio (W/L, W and L representing the channel width (W) and length (L) respectively) that is identical to each other but different with respect to the fourth transistor M4, a proportional-to-absolute-temperature (PTAT) circuit 230 consisting of a first diode D1 and a second resistor R2 in series with and a second diode D2, each of these diodes being differently sized with a ratio of the area of diode D2 to the area of diode D1 equal to N, first and third resistors R1 and R3, and an operational amplifier 210 that may be a CMOS amplifier, namely designed using CMOS transistors, in order to minimize power consumption.

The operational amplifier 210, which is self-biased by the fourth transistor M4, drives the current mirror circuit 220 through its output terminal OUT that is coupled to the gate terminals G of the four transistors M1-M4. The operational amplifier 210 has two complementary input terminals, namely a non-inverting input terminal IN+ at a voltage potential Vin+ and an inverting input terminal IN− at a voltage potential $V_{in-}$. The first resistor R1, which is connected in parallel across the first diode D1, has a first terminal connected to the non-inverting terminal IN+ and a second terminal connected to a negative power supply terminal, which may be at $V_{SS}$. The first diode D1 has its anode terminal connected to the non-inverting terminal and its cathode terminal connected to $V_{SS}$. The second resistor R2, which is in series with the second diode D2, has a third terminal connected to the inverting input terminal IN− and a fourth terminal connected to the anode of the second diode D2. The cathode of the second diode D2 is connected to $V_{SS}$. The third resistor R3 is connected in parallel across the branch (R2, D2), i.e. between the third terminal and VSS. The source S of each of the four transistors M1-M4 is connected to a positive power supply terminal, which may be at a constant reference level, such as $V_{DD}$. The drain of the first transistor M1 is connected to the non-inverting input terminal IN+, whereas the drain of the second transistor M2 is connected to the inverting input terminal IN−. The current $I_1$ that flows through the first transistor M1 is split into a current $I_{1a}$ through the first diode D1 and a current I1b through the first resistor R1. The current $I_2$ that flows through the second transistor M2 is split into a current $I_{2a}$ through the series branch (R2, D2) and a current $I_{2b}$ through the third resistor R3. Due to the current mirror arrangement with transistors M1-M4 having the same aspect ratio (W/L), the transistors M1-M2 source the same amount of currents $I_1$, $I_2$ which is mirrored to the third transistor M3, such that the output current $I_{ref}$ is identical to $I_1$ and $I_2$.

The principle of this reference current source 200 lies on the generation of a reference current Iref that is both the sum ($I_{1a}+I_{1b}$, $I_{2a}+I_{2b}$) of a current $I_{1a}$, $I_{2a}$ having a positive temperature coefficient (PTC) and another current $I_{1b}$, $I_{2b}$ having a negative temperature coefficient (NTC) in order to compensate temperature change.

The current $I_f$ that flows through a forward-biased diode can be given by the well-known Shockley ideal diode equation, according to as follows:

$$I_f = I_s \left( e^{\frac{V_f}{V_T}} - 1 \right) \tag{1}$$

where $I_s$ is called saturation current, $V_f$ is the voltage across the forward-biased diode which has a negative temperature coefficient (NTC), and $V_T$ is the thermal voltage which exhibits a positive temperature coefficient (PTC) as defined by the following dependence relation with the temperature T:

$$V_T = \frac{kT}{q} \tag{2}$$

where q is the elementary charge ($1.602 \times 10^{-19}$ C), k is Boltzmann's constant ($1.3807 \times 10^{-23}$ J/K), and T is the absolute temperature of the P-N junction of a diode.

Due to the fact that VT can usually be neglected with respect to the voltage $V_f$, equation (1) can further be approximated as:

$$I_f \cong I_s \left( e^{\frac{V_f}{V_T}} \right) \quad V_f \gg V_T \tag{3}$$

from which we can derive the voltage $V_f$ given by:

$$V_f = V_T \ln \frac{I_f}{I_s} \tag{4}$$

The equality between the currents $I_1$ and $I_2$ can be expressed as:

$$I_{1a}+I_{1b}=I_{2a}+I_{2b} \tag{5}$$

During operation, the operational amplifier 210 forces its two complementary input terminals IN+ and IN− to a same voltage potential in the steady state, which yields:

$$V_{in+}=V_{in-} \tag{6}$$

According to conventional practice and easier manipulation of the numbers, the resistors R1 and R3 will be also set equal to each other, such that:

$$R1=R3 \tag{7}$$

Under these conditions, we obtain:

$$I_{1b}=I_{2b} \tag{8}$$

Reporting equation (8) into equation (5), it results that:

$$I_{1a}=I_{2a} \tag{9}$$

As illustrated in FIG. 3 and using equation (4), we get:

$$V_{in-} = V_{in+} = V_{f1} \tag{10}$$

$$I_{1a} = I_{2a} = \frac{\Delta V_f}{R_2} = \frac{V_{f1} - V_{f2}}{R_2} = \frac{V_T \ln\left(N \frac{I_{1a}}{I_{2a}}\right)}{R_2} = \frac{V_T \ln(N)}{R_2} \tag{11}$$

$$I_{1b} = I_{2b} = \frac{V_{f1}}{R_3} = \frac{V_T \ln\left(\frac{I_{1a}}{I_s}\right)}{R_3} \tag{12}$$

where $V_{f1}$ is the voltage across the forward-biased diode D1, $V_{f2}$ is the voltage drop across the forward-biased diode D2, and N is the ratio of the area of diode D2 to the area of diode D1. It is also noted that the diode D2 may be replaced by a set of N parallel-connected diodes D2$i$ having the same size as the diode D1, such that each of the diodes D2$_i$ is passed through by a current equal to $I_{2a}$/N, with N being an integer at least equal to two.

From equation (11), it can be seen that the currents $I_{1a}$ or $I_{2a}$ that are provided by the PTAT circuit 230 exhibit a positive temperature coefficient (PTC) while being a function of the difference $\Delta V_f$, also called voltage proportional to absolute temperature ($V_{PTAT}$), between the forward-biased voltages $V_{f1}$ and $V_{f2}$, which is proportional to the thermal voltage $V_T$.

From equation (12), it can be seen that the currents $I_{1b}$ or $I_{2b}$ are a function of the forward-biased voltage $V_{f1}$ that exhibits a negative temperature coefficient (NTC) while having its voltage $V_{f1}$ decreasing with increasing temperature.

Thus, the PTC of $\Delta V_f$ and NTC of the built-in voltage $V_f$ are compensated, such that the reference current source 200 outputs a temperature-compensated reference current $I_{ref}$(=$I_{1a}$+$I_{1b}$=$I_{2a}$+$I_{2b}$) from its output terminal REF.

Moreover, such a reference current source 200 shows a sensitivity with respect to changes in process parameters that is quite low.

Additionally, the positive power supply that provides a constant reference voltage $V_{DD}$ will be preferably an internal low voltage supply, such as the digital core voltage supply, for example, which is present on-chip, namely on every integrated circuit, with a constant value ranging usually around 1.0 V.

Finally, the reference current source 200 can be considered as a low voltage bandgap current reference circuit outputting a reference current $I_{ref}$ that is independent of the PVT variations.

It should be noted that the term "diode" is being used herein to denote any device that behaves like a forward-biased semiconductor P-N junction device. A typical example of such a device would be a diode-connected dynamic threshold channel-P metal oxide semiconductor field effect transistor (P-MOSFET) with the n-well connected to the gate, short-circuiting the gate, n-well, and drain to ground and the source of said P-MOSFET being the anode, or the collector and the base of a bipolar junction transistor (BJT).

It should additionally be noted that although the transistors M1-M4 shown in FIG. 3 are of type channel-P metal oxide semiconductor (PMOS) transistors, channel-N metal oxide semiconductor (NMOS) transistors could also be used while reversing the direction of current flow and polarity of the remainder of the circuit 200.

It should furthermore be noted that the transistors M1-M4 shown in FIG. 3 will be preferably transistors designed for low-voltage operation, namely exhibiting reduced threshold voltages, such as native transistors for example.

Figure 4:
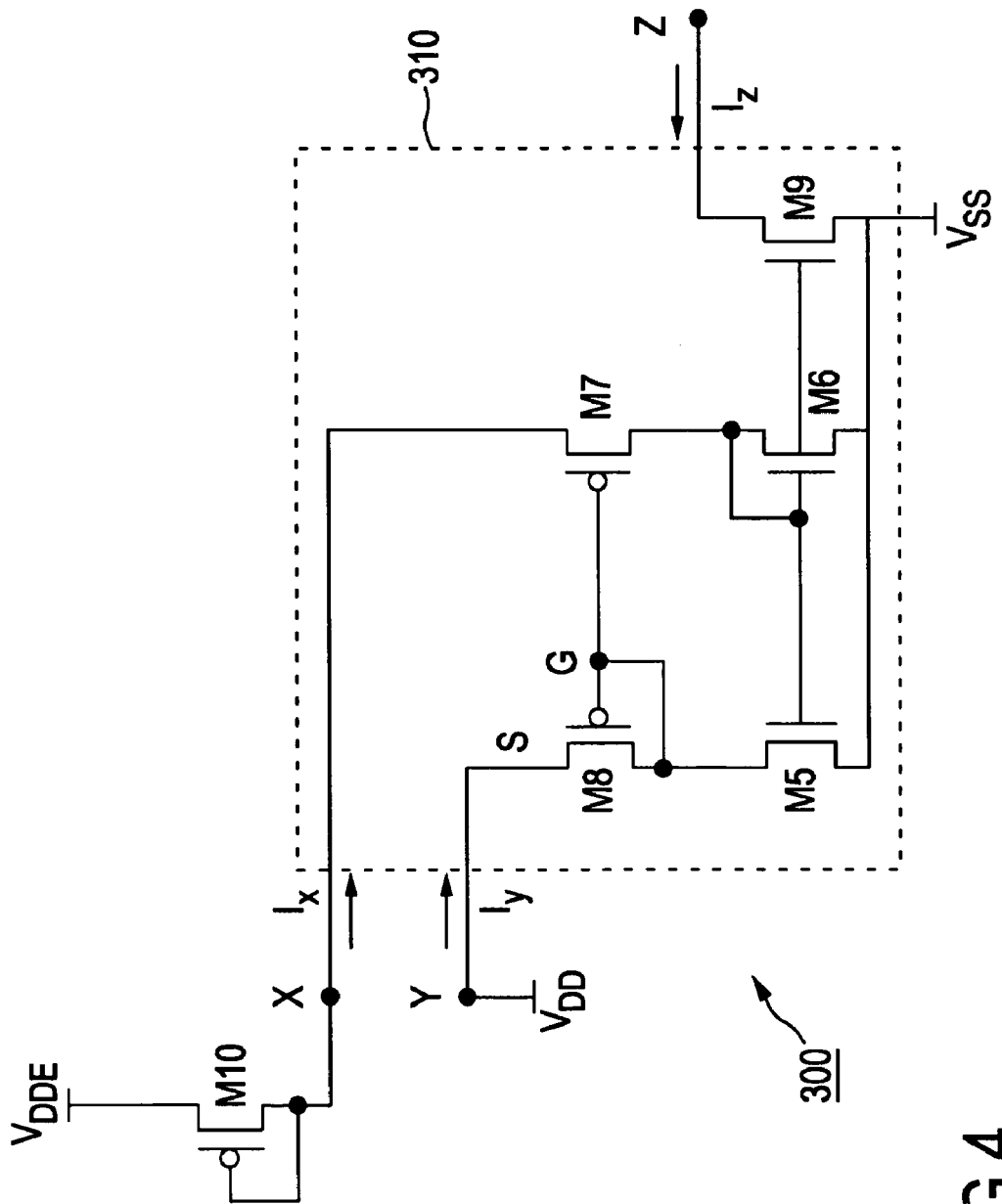
FIG. 4 shows a schematic diagram of a sensing circuit based on a current conveyor such as used in the compensated buffer circuit of FIG. 2.

FIG. 4 illustrates a schematic diagram of a sensing circuit 300 such as used in the compensation circuit 100 according to the preferred embodiment of the invention. Such a low power sensing circuit 300 is based on a current conveyor 310, such as a first generation current conveyor (CCI) wherein the node Y is a finite impedance node with a current $I_y$ flowing into it. The node Y is connected to a positive power supply terminal which may be at a constant reference level such as $V_{DD}$ for example. A diode-connected transistor M10, which has the same polarity as the diode-connected transistor M8 and transistor M7, is connected between the node X and another positive power supply terminal at $V_{DDE}$, which will be higher than $V_{DD}$ (±1.0 V) while being ranged, for an Input/Output supply voltage for example, between 1.8 V and 2.5 V. Due to the current mirror arrangement formed by the transistors M5, M6 and M9 having the same aspect ratio (W/L) and a reverse polarity with respect to the diode-connected transistor M10, the current $I_x$ that flows through the transistors M10, M7, M6, the current $I_y$ that flows through the transistors M8, M5, and the detection current $I_z$ that flows through the transistor M9 are all identical, and this regardless of the voltage potential being applied at node Y. The diode-connected transistor M8, that is passed through by the same current as the transistor M7 whose size is identical, will then guarantee that the voltage VGS across the source and gate terminals is the same for both transistors M8, M7, which share the same gate terminal G and thus form a current mirror. Since the source terminal S of the diode-connected transistor M8 is also connected to the node Y, it results that the node X will be at the same voltage potential as the node Y, namely that the nodes X and Y will be as virtually short-circuited. It should be noted that the virtual voltage potential appearing at node X will not be affected by the value of the current $I_x$, such that the first generation current conveyor (CCI) has a zero input impedance. Finally, a low voltage difference ΔV between both positive power supplies at $V_{DDE}$ and $V_{DD}$ is applied across the single diode-connected transistor M10, such that it is passed through by a low level of current $I_x$ and it is hence not necessary to have a series arrangement of several diode-connected transistors for reasonably reducing this current $I_x$. The influence of the process parameters (threshold voltage, carrier mobility, . . . ), supply voltage, and temperature is then monitored by the single diode-connected transistor, such that the power consumption of said current conveyor will be drastically reduced. The low current Ix, which is sourced from the node X at a low impedance level, is then replicated into the detection current $I_z$, which is dependent on PVT variations and supplied by the transistor M9 from the node Z at a high impedance level to the current mode ADC 400.

It should be noted that although the first group of transistors M7, M8, M10 shown in FIG. 4 is of type PMOS transistors, and the second group of transistors M5, M6, M9 is of type NMOS transistors, implementation of such transistor groups can also be carried out with a reverse polarity, while inverting the direction of current flow and polarity of the remainder of the circuit 300.

Furthermore, it should be noted that the present invention is not limited to any particular buffer circuit. Rather, the invention is more generally applicable to any circuit arrangement in which it is desirable to provide improved compensation techniques for accurately compensating for at least process, voltage and temperature variations in the circuit.

In summary, a compensation circuit 100 for providing compensation over process, voltage and temperature (PVT) variations within an integrated circuit has been described. Using a low voltage reference current source 200, the compensation circuit 100 generates directly, from an on-chip reference low voltage supply $V_{DD}$, a reference current $I_{ref}$ that is constant over PVT variations, whereas a detection current $I_z$ that is variable over PVT variations is generated by a sensing circuit 300, which is based on a current conveyor 310, from a low voltage supply ($V_{DDE}$–$V_{DD}$) applied across a single diode-connected transistor M10 corresponding to a voltage difference between two reference low voltage supplies. Both currents $I_{ref}$, $I_z$ are then compared inside a current mode analog-to-digital converter 400 that outputs a plurality of digital bits. These digital bits can be subsequently used to compensate for PVT variations in an I/O buffer circuit 500.

When interpreting the present description and its associated claims, expressions such as "comprise", "include", "incorporate", "contain", "is", and "have" are to be construed in a non-exclusive manner, namely construed to allow for other items or components, which are not explicitly defined, also to be present. Reference to the singular is also to be construed to be a reference to the plural and vice versa.

Furthermore, the invention may also be embodied with less components than provided in the embodiments described here, wherein one component carries out multiple functions. Just as well may the invention be embodied using more elements than depicted in the Figures, wherein functions carried out by one component in the embodiment provided are distributed over multiple components.

A person skilled in the art will readily appreciate that various parameters disclosed in the description may be modified and that various embodiments disclosed and/or claimed may be combined without departing from the scope of the invention.

It is stipulated that the reference signs in the claims do not limit the scope of the claims, but are merely inserted to enhance the legibility of the claims.

The invention claimed is:

1. A compensation circuit for providing compensation for one of process, voltage and temperature (PVT) variations within an integrated circuit, said compensation circuit comprising at least:
   a reference circuit for generating a reference current that is constant over PVT variations, said reference circuit being configured to directly generate said reference current from a first voltage supply, which is internal to said integrated circuit and configured to provide a low voltage supply, wherein the generation of the reference current is based on a sum of a current having a positive temperature coefficient and another current having a negative temperature coefficient in order to compensate temperature change; and
   a sensing circuit, which comprises an output terminal and which is configured to provide at said output terminal a detection current ($I_z$) that is variable over PVT variations, and to sense said PVT variations through said detection current.

2. A compensation circuit according to claim 1, wherein said reference circuit comprises:
   a proportional-to-absolute-temperature (PTAT) circuit, which comprises a first diode element and a series arrangement of a second diode element and a second resistor, said first diode element and said series arrangement being configured to allow said PTAT circuit to exhibit a positive temperature coefficient (PTC) through a voltage difference across said second resistor between a voltage across said first diode element and a voltage across said series arrangement;

first and third resistive elements, which are respectively connected in parallel with said first diode element and said series arrangement, said first and third resistive elements being respectively passed through by a first current and a third current both exhibiting a negative temperature coefficient (NTC) by being proportional to said voltage across said first diode element;

a current mirror, which comprises a drive input and at least first, second, and third current sources being supplied by said first voltage supply and having first, second, and third transistors respectively, said current mirror being configured to replicate a fifth current that passes through said first transistor into a sixth current that passes through said second transistor, and said sixth current into said reference current that passes through said third transistor, said fifth current and sixth current being constant over PVT variations; and an operational amplifier, which comprises at least a non-inverting input terminal and an inverting input terminal, said operational amplifier being connected to said current mirror and said PTAT circuit such that said non-inverting input terminal has a same voltage level as said voltage across said first diode element and said inverting input terminal has a same voltage level as that of said series arrangement, and configured to drive said current mirror through said drive input.

3. A compensation circuit according to claim 1, wherein said sensing circuit comprises:
  a current conveyor for conveying a current from an input terminal towards said output terminal, said current conveyor further comprising a reference terminal, which is connected to a reference voltage supply; and
  a diode-connected transistor for generating a low positive voltage drop across it, said diode-connected transistor being connected between a second voltage supply and said input terminal.

4. A compensation circuit according to claim 3, wherein said voltage drop is equal to a voltage difference between said second voltage supply and said reference voltage supply.

5. A compensation circuit according to claim 3, wherein said compensation circuit further comprises: an analog-to-digital converter, which is configured to provide at its output a plurality of digital bits based on a comparison between said reference current and said detection current.

6. A compensation circuit according to claim 5, wherein said compensation circuit further comprises: a buffer circuit, which is configured to receive at its input said plurality of digital bits.

7. A compensation circuit according to claim 1, wherein said first voltage supply is a digital core voltage supply.

8. A compensation circuit according to claim 4, wherein said reference voltage supply is said first voltage supply.

9. A compensation circuit according to claim 2, wherein said second diode element is a set of N parallel-connected diode elements, wherein N is an integer greater than unity.

10. A compensation circuit according to claim 2, wherein said fifth current is split into said first current and a fourth current that flows through said first diode element, and said sixth current is split into said third current and a second current that flows through said series arrangement.

11. A compensation circuit according to claim 2, wherein each one of said first and second diode elements is a diode-connected transistor.

12. A compensation circuit according to claim 3, wherein said current conveyor is a first generation current conveyor.

13. A method for providing compensation for at least one of process, voltage and temperature (PVT) variations within an integrated circuit, said method comprising at least the steps of:
  generating a reference current which is constant over PVT variations, said reference current being generated directly from a first voltage supply, which is internal to said integrated circuit and configured to provide a low voltage supply, wherein the generation of the reference current is based on a sum of a current having a positive temperature coefficient and another current having a negative temperature coefficient in order to compensate temperature change; and
  sensing PVT variations through a detection current which is variable over PVT variations, said detection current being provided by said sensing circuit.

14. A method according to claim 13, wherein said method further comprises the steps of:
  comparing said reference current and said detection current; and
  outputting a plurality of digital bits towards a buffer circuit for PVT compensation.

15. A method according to claim 13, wherein said sensing step comprises the steps of:
  conveying a current from an input terminal at low impedance level towards an output terminal at high impedance level, said input terminal being at a voltage level equal to that of a reference voltage supply; and
  generating a low positive voltage drop across a diode-connected transistor, said diode-connected transistor being connected between a second voltage supply and said input terminal.

16. A compensation circuit for providing compensation for one of process, voltage and temperature (PVT) variations within an integrated circuit, said compensation circuit comprising
  a reference circuit means for generating a reference current that is constant over PVT variations, said reference circuit means being configured to directly generate said reference current from a first voltage supply, which is internal to said integrated circuit and configured to provide a low voltage supply, wherein the generation of the reference current is based on a sum of a current having a positive temperature coefficient and another current having a negative temperature coefficient in order to compensate temperature change; and
  sensing circuit means comprising an output terminal, for providing at said output terminal a detection current ($I_z$) that is variable over PVT variations, and for sensing said PVT variations through said detection current.

17. A compensation circuit according to claim 16, wherein said reference circuit means comprises:
  a proportional-to-absolute-temperature (PTAT) circuit, which comprises
    a first diode element and a series arrangement of a second diode element and a second resistor, said first diode element and said series arrangement being configured to allow said PTAT circuit to exhibit a positive temperature coefficient (PTC) through a voltage difference across said second resistor between a voltage across said first diode element and a voltage across said series arrangement;
    first and third resistive elements, which are respectively connected in parallel with said first diode element and said series arrangement, said first and third resistive elements being respectively passed through by a first current and a third current both exhibiting a negative temperature coefficient (NTC) by being proportional to said voltage across said first diode element;

a current mirror, which comprises a drive input and at least first, second, and third current sources being supplied by said first voltage supply and having first, second, and third transistors respectively, said current mirror being configured to replicate a fifth current that passes through said first transistor into a sixth current that passes through said second transistor, and said sixth current into said reference current that passes through said third transistor, said fifth current and sixth current being constant over PVT variations; and an operational amplifier, which comprises at least a non-inverting input terminal and an inverting input terminal, said operational amplifier being connected to said current mirror and said PTAT circuit such that said non-inverting input terminal has a same voltage level as said voltage across said first diode element and said inverting input terminal has a same voltage level as that of said series arrangement, and configured to drive said current mirror through said drive input.

18. A compensation circuit according to claim 16, wherein said sensing circuit means comprises:

a current conveyor for conveying a current from an input terminal towards said output terminal, said current conveyor further comprising a reference terminal, which is connected to a reference voltage supply; and a diode-connected transistor for generating a low positive voltage drop across it, said diode-connected transistor being connected between a second voltage supply and said input terminal.

19. A compensation circuit according to claim 18, wherein said voltage drop is equal to a voltage difference between said second voltage supply and said reference voltage supply.

20. A compensation circuit according to claim 18, wherein said compensation circuit further comprises: an analog-to-digital converter means, which is configured to provide at its output a plurality of digital bits based on a comparison between said reference current and said detection current.

* * * * *